(12) United States Patent
Chen

(10) Patent No.: US 6,452,801 B1
(45) Date of Patent: Sep. 17, 2002

(54) HEAT SINK CLIP WITH SLIDABLE LOCKING BARS

(75) Inventor: Chun-Chi Chen, Shenzhen (CN)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/894,536

(22) Filed: Jun. 28, 2001

(30) Foreign Application Priority Data

Apr. 17, 2001 (CN) .......................................... 090206018

(51) Int. Cl.[7] .................................................. H05K 7/20
(52) U.S. Cl. ........................ 361/704; 361/703; 361/709; 257/718; 257/719; 174/16.2; 165/80.3; 24/625
(58) Field of Search .................................. 361/687, 703, 361/704, 709, 710, 717–719; 174/16.3; 165/80.3, 185; 257/718, 719, 727; 267/150, 158, 159, 160; 24/625

(56) References Cited

U.S. PATENT DOCUMENTS

| | | | | |
|---|---|---|---|---|
| 5,542,468 A | * | 8/1996 | Lin ........................... | 165/80.3 |
| 5,638,258 A | * | 6/1997 | Lin ........................... | 361/704 |
| 5,771,960 A | * | 6/1998 | Lin ........................... | 165/80.3 |
| 5,860,195 A | * | 1/1999 | Wang ........................ | 24/459 |
| 5,933,326 A | * | 8/1999 | Lee et al. ................. | 361/704 |
| 5,953,212 A | * | 9/1999 | Lee ........................... | 361/709 |

* cited by examiner

*Primary Examiner*—Boris Chervinsky
(74) *Attorney, Agent, or Firm*—Wei Te Chung

(57) ABSTRACT

A clip (10) comprises a pressing body (12) adapted to press onto a heat sink (40). First and second arms (14, 15) extend outwardly and upwardly from opposite ends of the pressing body. A pair of flanges (36) extends perpendicularly outwardly from opposite edges of the second arm. A horseshoe-shaped locking slot (38) is defined in each flange. An operation portion (24) extends upwardly and then downwardly from an end of the second arm. The operation portion has an engaging hole (18) for engagingly receiving a socket (50). A pair of locking bars (34) extends from opposite edges of the operation portion, and is slidably accommodated in the locking slots. Pushing the operation portion causes the locking bars to slide along the locking slots until they snap into place, whereby the clip is securely attached to the socket and firmly presses the heat sink against an electronic device (60).

16 Claims, 6 Drawing Sheets

HEAT SINK CLIP WITH SLIDABLE LOCKING BARS

BACKGROUND OF THE INVENTION

1. Field of the Invention

The present invention relates to clips used for a heat sink which readily attach the heat sink onto a heat-generating electronic device in a computer.

2. Description of Related Art

In a computer, a heat sink is often used to remove heat generated by certain electronic devices such as Central Processing Units (CPUs). A clip is frequently used to attach the heat sink to the electronic device.

Referring to FIGS. 5 and 6, a conventional clip 1 has a pressing body 2 and a pair of resilient arms 3 extending from opposite ends thereof. Each arm 3 defines an engaging hole 5 and an operation hole 6. In assembly, the clip 1 is placed on a heat sink 9. Initially, one engaging hole 5 engagingly receives one ear 7 of a socket 8. A tool (not shown) is inserted into the appropriate operation hole 6 to urge the other engaging hole 5 to engagingly receive the other ear 7, thereby securing the clip 1 to the socket 8. However, the clip 1 must be forcefully driven by the tool. The tool is prone to slip and damage components on and around the electronic device. This is particularly disruptive and costly on a mass production assembly line. Therefore, a new clip is desired, .to solve the above-mentioned problem.

SUMMARY OF THE INVENTION

Accordingly, an object of the present invention is to provide a clip which is easily and safely attaches a heat sink to an electronic device.

Another object of the present invention is to provide a clip which securely attaches a heat sink to an electronic device.

In order to achieve the objects set out above, a clip of the present invention comprises a pressing body adapted to press onto a heat sink. First and second arms extend outwardly and upwardly from opposite ends of the pressing body. A pair of flanges extends perpendicularly outwardly from opposite edges of the second arm. A horseshoe-shaped locking slot is defined in each flange. An operation portion extends upwardly and then downwardly from an end of the second arm. The operation portion has an engaging hole for engagingly receiving a socket. A pair of locking bars extends perpendicularly outwardly from opposite edges of the operation portion, and is slidably accommodated in the locking slots of the flanges. Pushing the operation portion causes the locking bars to slide along the locking slots until they snap into place, whereby the clip is securely attached to the socket and firmly presses the heat sink against an electronic device.

Other objects, advantages and novel features of the invention will become more apparent from the following detailed description when taken in conjunction with the accompanying drawings.

DETAILED DESCRIPTION OF THE INVENTION

Figure 1:
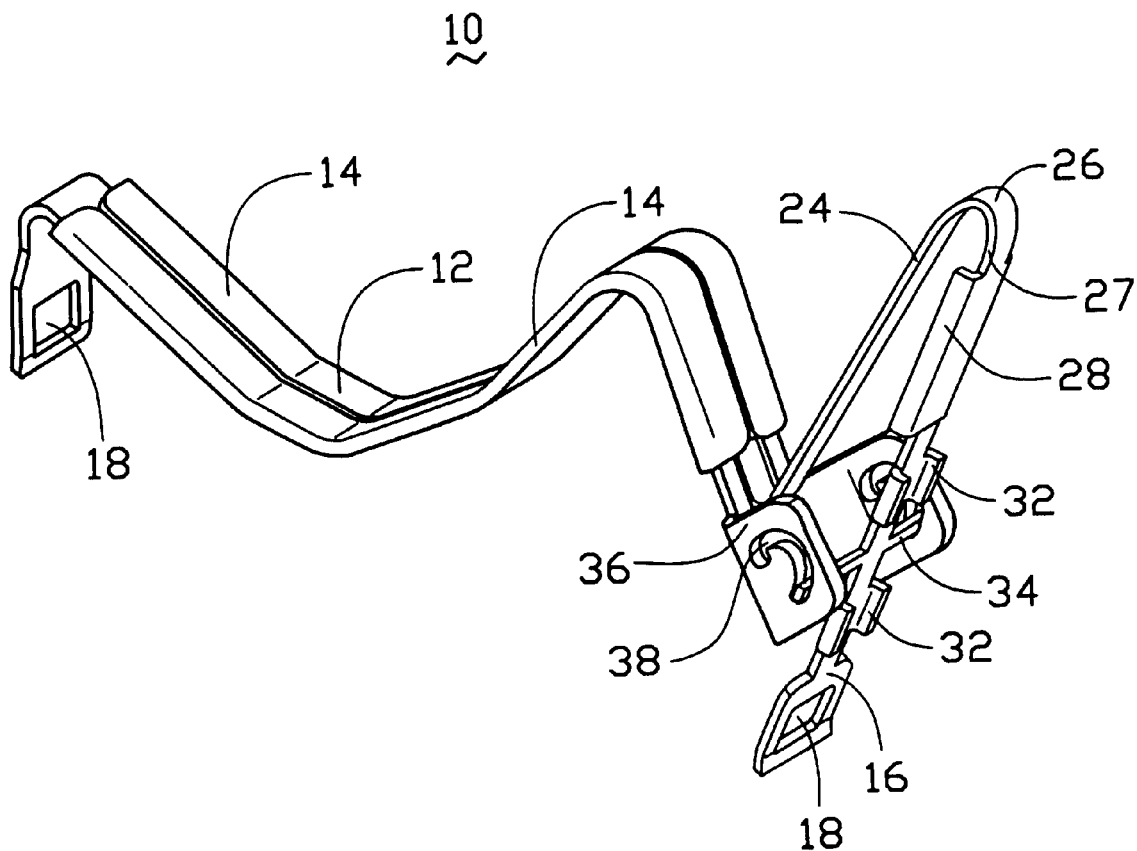
FIG. 1 is a perspective view of a clip in accordance with a preferred embodiment of the present invention.
Figure 2:
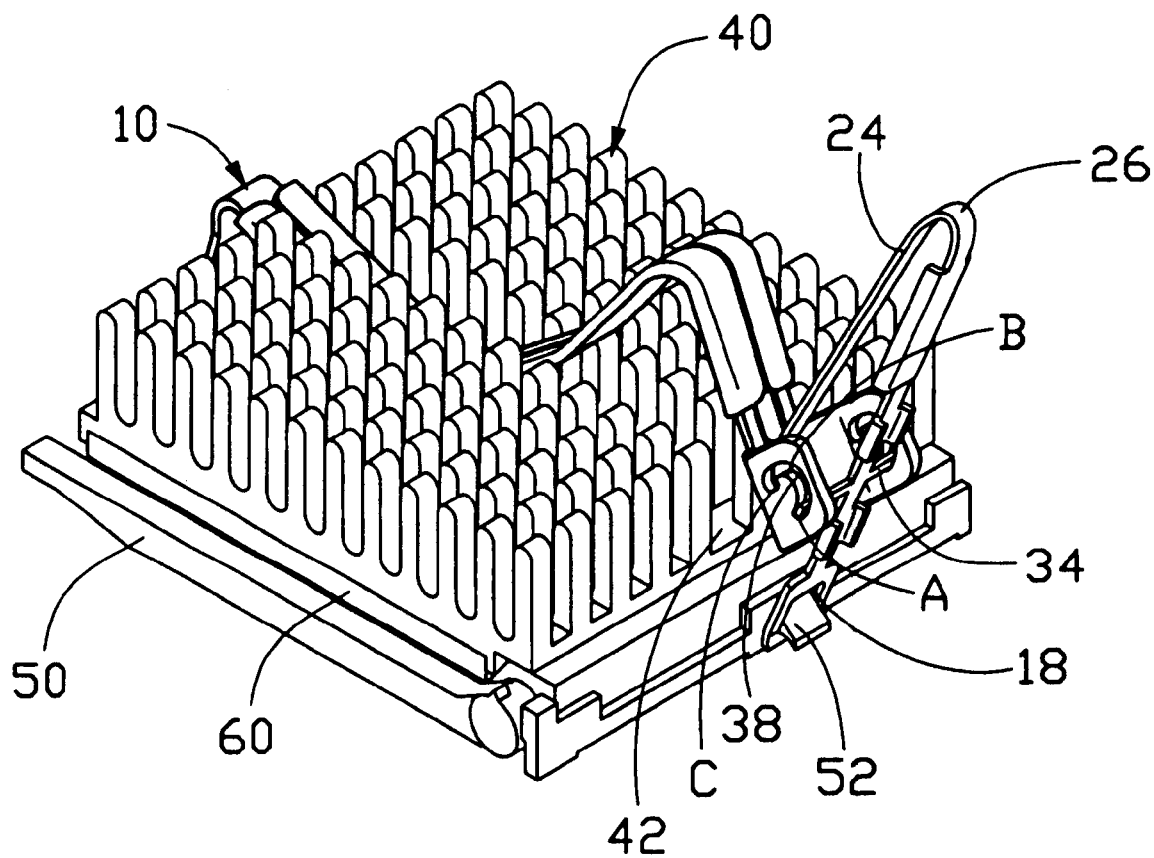
FIGS. 2 to 4 are perspective views of progressive stages of attaching the clip of FIG. 1 to a socket to thereby press a heat sink against a CPU mounted on the socket.

FIGS. 1 and 2 show a clip 10 in accordance with a preferred embodiment of the present invention. The clip 10 is used to press a heat sink 40 onto a CPU 60 mounted on a socket 50.

Referring particularly to FIG. 2, the heat sink 40 has a base and a plurality of fins extending upwardly therefrom. A receiving groove 42 is defined through a middle of the fins from one side of the base to an opposite side of the base, for receiving the clip 10. The socket 50 forms a pair of ears 52 on opposite sides thereof, for engaging with the clip 10.

Referring particularly to FIG. 1, the clip 10 has a central pressing body 12 and first and second resilient arms 14, 15 extending outwardly from opposite ends of the pressing body 12 respectively. Opposite longitudinal edge portions of the pressing body 12 and first and second resilient arms 14, 15 are folded back inwardly to double over the pressing body 12 and first and second resilient arms 14, 15 respectively, thereby reinforcing the clip 10 and also allowing safe manual operation. The first arm 14 defines an engaging hole 18 near a distal end thereof. A pair of flanges 36 extends perpendicularly outwardly from opposite longitudinal edges of the second arm 15 at a distal end of the second arm 15. A horseshoe-shaped locking slot 38 is defined in each flange 36. Each flange 36 has a farthest point A adjacent a bottommost extremity of the slot 38, a nearest point C adjacent an opposite extremity of the slot 38, and a vertex B below and adjacent an uppermost portion of the slot 38.

An operation portion 24 extends upwardly and outwardly from a distal end of the second arm 14 between the flanges 36, and then bends back over itself to extend downwardly and thereby form an elongate outer section 27. An arch-shaped top section 26 is thus formed where the operation portion 24 extends upwardly and then downwardly. A hand 16 is formed at a distal end of the outer section 27. An engaging hole 18 is defined in the hand 16. A pair of locking bars 34 extends perpendicularly outwardly from respective opposite longitudinal edges of the outer section 27. Distal ends of the locking bars 34 are. slidably accommodated in the corresponding slots 38. A pair of reinforcing ribs 32 extends perpendicularly outwardly from opposite longitudinal edges of the outer section 27 above the locking bars 34. Another pair of reinforcing ribs 32 extends perpendicularly outwardly from opposite longitudinal edges of the outer section 27 below the locking bars 34. A further pair of reinforcing ribs 28 extends perpendicularly inwardly from opposite longitudinal edges of the outer section 27 above the uppermost reinforcing ribs 32.

Figure 3:
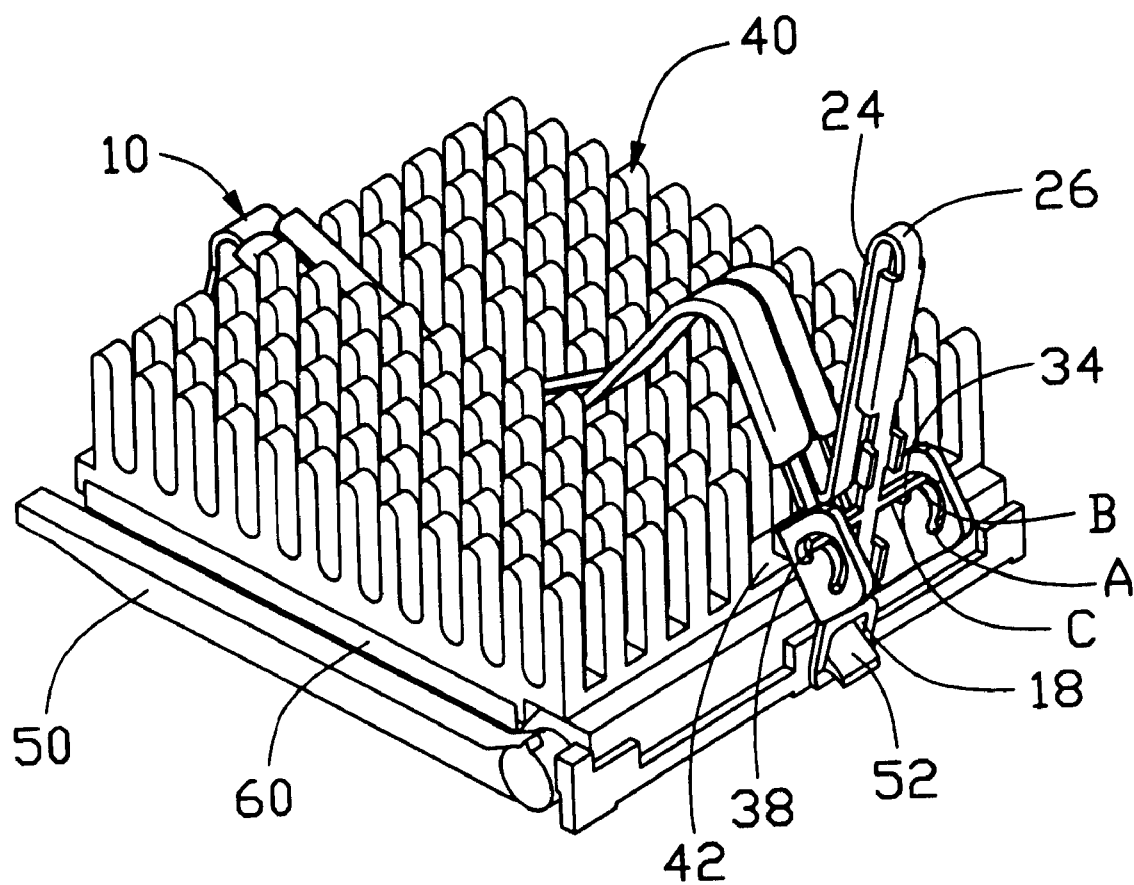
Figure 4:
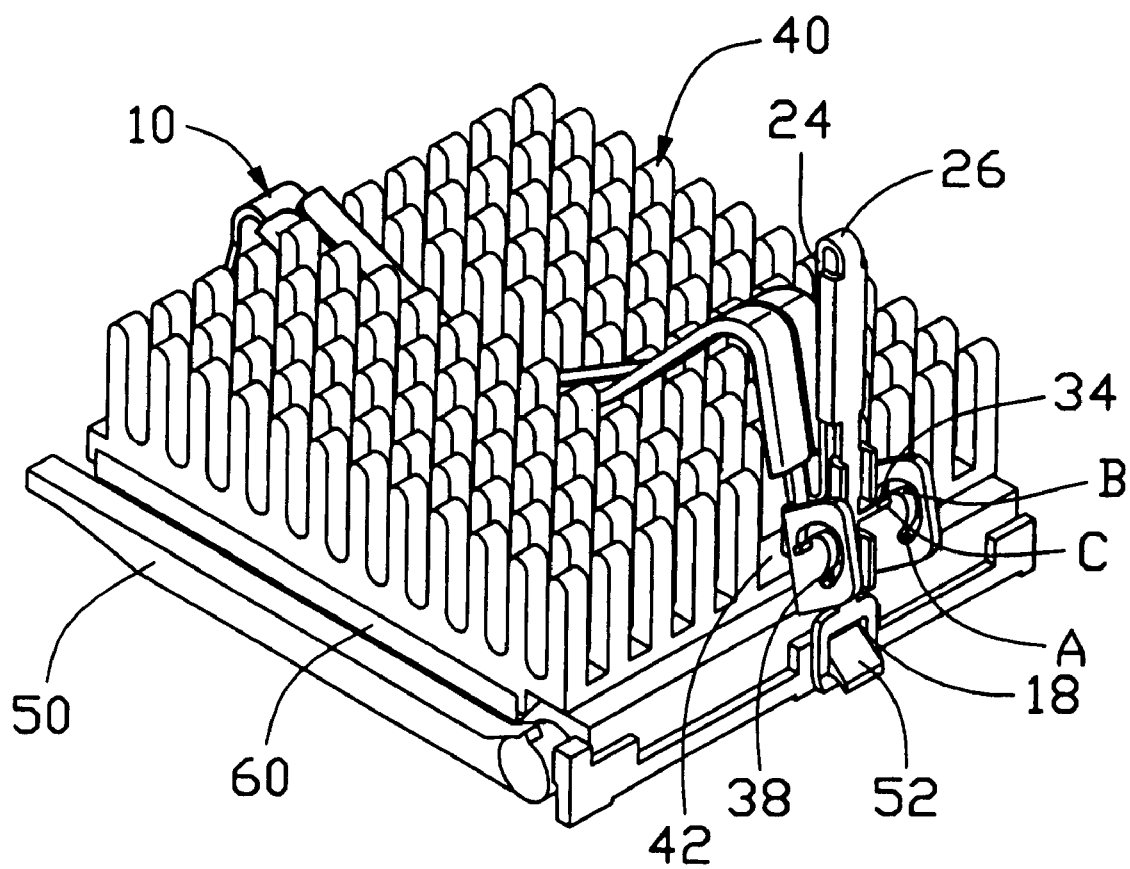
Figure 5:
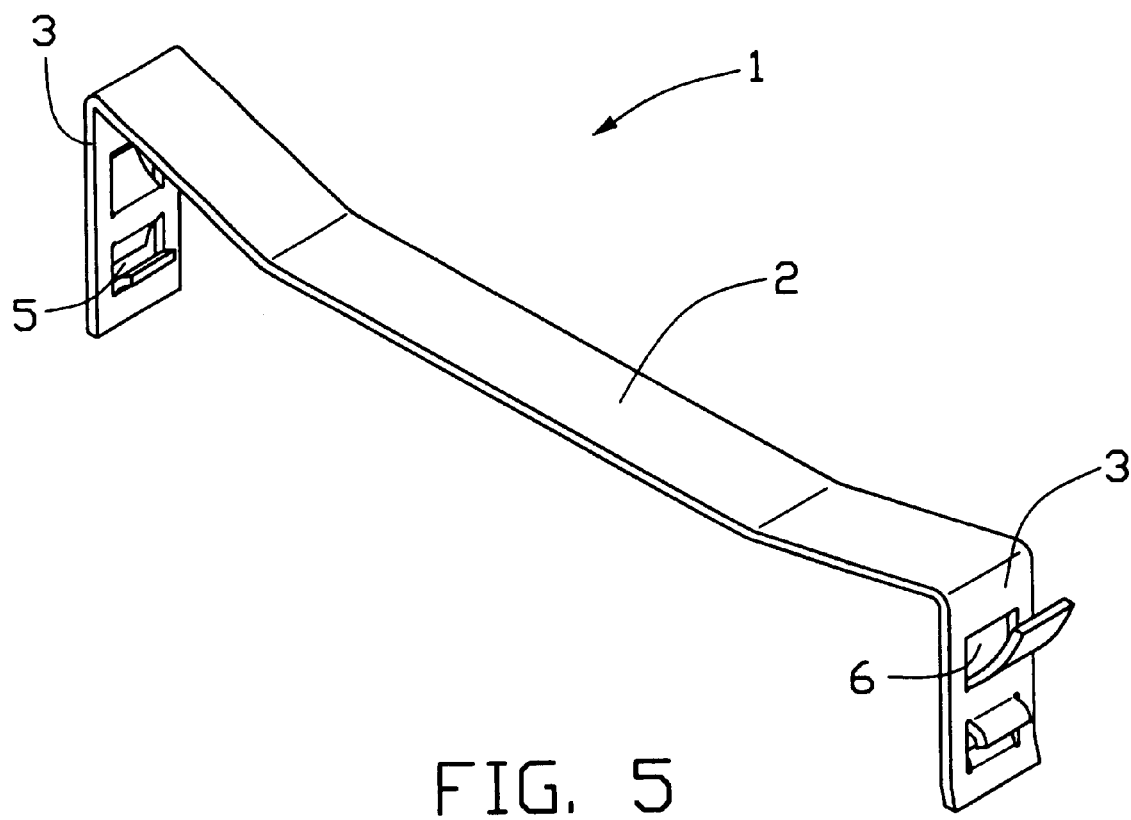
FIG. 5 is a perspective view of a conventional clip.
Figure 6:
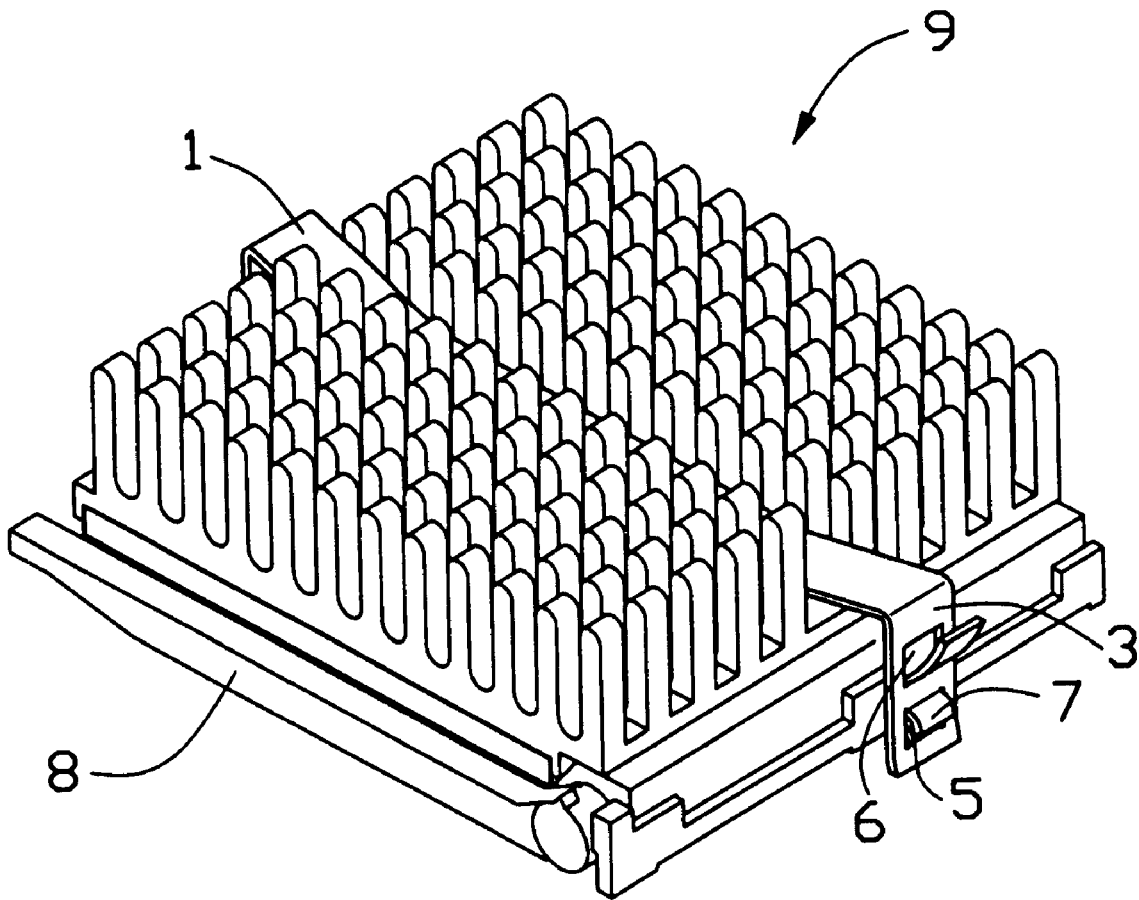
FIG. 6 is a perspective view of a conventional clip attached to a socket to thereby press a heat sink against a CPU mounted on the socket.

FIGS. 2 to 4 show progressive stages of attaching the clip 10 to the socket 50 to thereby press the heat sink 40 against the CPU 60 mounted on the socket 50. The clip 10 is first placed in the receiving groove 42 of the heat sink 40. The engaging holes 18 of the first arm 14 and the hand 16 loosely receive the ears 52 of the socket 50. The locking bars 34 of the operation portion 24 are initially located at the farthest points A of the flanges 36, as shown in FIG. 2. Then the top section 26 of the operation portion 24 is pushed toward the pressing body, thus causing the locking bars 34 to slide along the slots 38. The locking bars 34 slide compliantly over the vertices B of the flanges 36 (see FIG. 3) and finally snap into place at the nearest points C of the flanges 36 (see FIG. 4). The clip 10 is thereby securely attached to the socket 50, and firmly presses the heat sink 40 against the CPU 60.

To detach the clip 10 from the heat sink 40, the top section 26 is pulled outwardly and downwardly. The locking bars 34 slide back to the farthest point A. The clip 10 is thus loosened from the socket 50 and the heat sink 40, and is readily removed.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A clip for attaching a heat sink to an electronic device, comprising:
   a pressing body adapted to press onto the heat sink;
   a first arm extending from one end of the body, the first arm having an engaging hole defined therein adapted for engaging with a socket onto which the electronic device is to be mounted;
   a second arm extending from an opposite end of the body, a pair of flanges extending from opposite edges of the second arm, a locking slot being defined in each flange; and
   an operation portion extending upwardly and then downwardly from an end of the second arm, the operation portion having an engaging hole adapted for engaging with the socket, and a pair of locking bars extending from opposite edges of the operation portion, the locking bars being slidably accommodated in the locking slots of the second arm, whereby pushing the operation portion toward the pressing body causes the locking bars to slide along the locking slots and thereby snappingly secure the clip to the socket.

2. The clip as described in claim 1, wherein each locking slot of the second arm is curved.

3. The clip as described in claim 1, wherein each locking slot of the second arm is generally horseshoe-shaped.

4. The clip as described in claim 1, wherein a generally arch-shaped top section is formed where the operation portion extends upwardly and then downwardly.

5. The clip as described in claim 1, wherein opposite edge portions of the pressing body are folded back inwardly to double over the pressing body.

6. The clip as described in claim 1, wherein at least one reinforcing rib extends from at least one of opposite edges of the operation portion.

7. The clip as described in claim 1, wherein at least one pair of reinforcing ribs extends inwardly from opposite edges of the operation section, and at least one pair of reinforcing ribs extends outwardly from opposite edges of the operation section.

8. A heat sink assembly for dissipating heat generated by an electronic device, comprising:
   a heat sink having a base and a plurality of fins extending therefrom; and
   a clip for attaching the heat sink to the electronic device, the clip comprising:
   a pressing body received between fins of the heat sink;
   a first arm extending from one end of the pressing body, the first arm having an engaging hole defined therein adapted for engaging with a socket onto which the electronic device is to be mounted;
   a second arm extending from an opposite end of the pressing body, a pair of flanges extending from opposite edges of the second arm, a locking slot being defined in each flange; and
   an operation portion extending from an end of the second arm, the operation portion having an engaging hole adapted for engaging with the socket, and a pair of locking bars extending from opposite edges of the operation portion, the locking bars being slidably accommodated in the locking slots of the second arm, whereby pushing the operation portion toward the pressing body causes the locking bars to slide along the locking slots and thereby snappingly secure the clip to the socket.

9. The heat sink assembly as described in claim 8, wherein each locking slot of the second arm is curved.

10. The heat sink assembly as described in claim 8, wherein each locking slot of the second arm is generally horseshoe-shaped.

11. The heat sink assembly as described in claim 8, wherein the operation portion extends upwardly and then downwardly from an end of the second arm such that a generally arch-shaped top section is formed.

12. The heat sink assembly as described in claim 8, wherein opposite edge portions of the pressing body are folded back inwardly to double over the pressing body.

13. The heat sink assembly as described in claim 8, wherein at least one reinforcing rib extends from at least one of opposite edges of the operation portion.

14. The heat sink assembly as described in claim 8, wherein at least one pair of reinforcing ribs extends inwardly from opposite edges of the operation portion and at least one pair of reinforcing ribs extends outwardly from opposite edges of the operation portion.

15. A clip for attaching a heat sink to an electronic device, comprising:
   a pressing body adapted to press onto the heat sink, first and second arms extending from opposite ends of the body, a free end of each of the first and second arms defining an engaging hole adapted for engaging the first and second arms with a socket onto which the electronic device is to be mounted; and
   locking means for slidably locking the free end of the second arm in a locked position and thereby securing the clip to the socket; wherein
   the locking means comprises at least one slot and at least one bar slidably accommodated in the at least one slot; wherein
   the at least one slot is curved; wherein
   a free end of the second arm extends upwardly and then downwardly to facilitate loading of resilient energy therein and thereby facilitate operation.

16. A clip adapted for pressing a heat sink against an electronic device, comprising:
   an elongated body adapted for pressing against the heat sink; and
   first and second arms respectively depending from opposite ends of the body, each arm forming an engaging configuration near its distal end, wherein the second arm further forms at least one curved slot and at least one bar extending into and slidably movable within the at least one curved slot between a lower position and an upper position, wherein at the lower position the clip is unlocked and at the upper position the clip is locked; wherein the at least one curved slot is defined in at least one flange extending outwardly from at least one of opposite edges of the second arm.

\* \* \* \* \*